(12) United States Patent
Rathod et al.

(10) Patent No.: US 11,094,445 B2
(45) Date of Patent: Aug. 17, 2021

(54) ELECTRICAL EQUIPMENT HAVING AN ASSEMBLY WITH A CYLINDRICAL BELLOW FOR PRESSURE AND VOLUME COMPENSATION

(71) Applicant: ABB Power Grids Switzerland AG, Baden (CH)

(72) Inventors: Yogesh Bhikhabhai Rathod, Vadodara (IN); Ankit Atulkumar Joshi, Vadodara (IN); Kalpesh Ishwarbhai Chauhan, Vadodara (IN)

(73) Assignee: ABB Power Grids Switzerland AG, Baden (CH)

( * ) Notice: Subject to any disclaimer, the term of this patent is extended or adjusted under 35 U.S.C. 154(b) by 0 days.

(21) Appl. No.: 16/769,825

(22) PCT Filed: Jul. 13, 2018

(86) PCT No.: PCT/IB2018/055187
§ 371 (c)(1),
(2) Date: Jun. 4, 2020

(87) PCT Pub. No.: WO2019/111064
PCT Pub. Date: Jun. 13, 2019

(65) Prior Publication Data
US 2020/0373058 A1    Nov. 26, 2020

(30) Foreign Application Priority Data

Dec. 8, 2017  (IN) .............................. 201741044109

(51) Int. Cl.
*H01F 27/14*     (2006.01)
*F16H 57/04*     (2010.01)
*H05K 5/06*      (2006.01)

(52) U.S. Cl.
CPC ......... *H01F 27/14* (2013.01); *F16H 57/0476* (2013.01); *H05K 5/069* (2013.01)

(58) Field of Classification Search
CPC .......... H01F 27/14; H01F 27/12; H01F 27/02; H05K 5/069; H05K 5/06; H05K 5/0004; H05K 5/068; H05K 5/067; F16H 57/0479
See application file for complete search history.

(56) References Cited

U.S. PATENT DOCUMENTS 3,670,276 A  *  6/1972  Theodore ................ H01F 27/02
                                                              336/92
2011/0203379 A1*  8/2011  Virtanen ................ H05K 5/068
                                                              73/708

(Continued)

FOREIGN PATENT DOCUMENTS

CN            2209380 Y      10/1995
CN          201007938 Y       1/2008

(Continued)

OTHER PUBLICATIONS

Hydra Metal Bellows Manual—0441e-02-01-10-20, Witzenmann GmbH, Jan. 2010, 128 pages.

(Continued)

*Primary Examiner* — Timothy J Thompson
*Assistant Examiner* — Amol H Patel
(74) *Attorney, Agent, or Firm* — Sage Patent Group

(57) ABSTRACT

An oil filled electrical equipment includes an assembly for oil filling and hermetically sealing the electrical equipment. The assembly includes a cylindrical bellow mounted on a plate of the electrical equipment with one or more fittings. The bellow provides pressure and volume compensation in the electrical equipment. The bellow includes a cylinder with a plurality of convolutions for expanding and contracting to provide the compensation. The bellow further includes two covers attached with the cylinder at two ends (Continued)

of the cylinder. Each cover includes a cylindrical part that is open at a first end and closed at a second end. The first end terminates at a circular face for mounting the cover on a convolution at a corresponding end of the cylinder. The second end includes an opening for oil filling and hermetically sealing the electrical equipment, and mounting the bellow on the plate.

10 Claims, 4 Drawing Sheets

(56) References Cited

U.S. PATENT DOCUMENTS

| | | | | |
|---|---|---|---|---|
| 2013/0167962 A1* | 7/2013 | Skjetne | ................... | F16L 55/04 138/30 |
| 2015/0260203 A1* | 9/2015 | Launonen | ................. | F15B 1/24 138/31 |
| 2016/0239027 A1* | 8/2016 | Klingsheim | ............ | B23P 15/00 |
| 2017/0025213 A1* | 1/2017 | Reising | ................... | H01F 27/20 |
| 2017/0055356 A1* | 2/2017 | Kristensen | ............. | H05K 5/068 |
| 2017/0085071 A1* | 3/2017 | Burrow | ................... | H05K 5/068 |
| 2017/0148565 A1* | 5/2017 | Zhang | ..................... | H01F 27/02 |
| 2018/0020570 A1* | 1/2018 | Fujiwara | ............ | H05K 7/20418 |

FOREIGN PATENT DOCUMENTS

| | | |
|---|---|---|
| CN | 107221412 A | 9/2017 |
| GB | 425169 A | 3/1935 |

OTHER PUBLICATIONS

International Search Report and Written Opinion of the International Searching Authority, PCT/IB2018/055187, dated Oct. 5, 2018, 11 pages.

* cited by examiner

ELECTRICAL EQUIPMENT HAVING AN ASSEMBLY WITH A CYLINDRICAL BELLOW FOR PRESSURE AND VOLUME COMPENSATION

CROSS REFERENCE TO RELATED APPLICATIONS

This application is a 35 U.S.C. § 371 national stage application of PCT International Application No. PCT/IB2018/055187 filed on Jul. 13, 2018, which in turns claims foreign priority to Indian Patent Application No. 201741044109, filed on Dec. 8, 2017, the disclosures and content of which are incorporated by reference herein in their entirety.

FIELD OF THE DISCLOSURE

The present disclosure generally relates to expansion bellows for electrical equipment. More specifically, the present disclosure relates to an oil-filled electrical equipment, which comprises an assembly with a cylindrical bellow for pressure and volume compensation in the electrical equipment.

BACKGROUND OF THE DISCLOSURE

Expansion bellows are used in manufacturing to simplify assembly, evacuation/drying and oil filling process. A disc bellow is typically used in electrical equipment such as instrument transformers (such as Capacitor Voltage Transformer (CVT)). The disc bellow comprises of two discs, and fittings. FIG. 1 shows a sectional view of a disc bellow attached to a plate of an electrical equipment. The two discs are welded at the edges and near the center. The disc bellow is mounted using the fitting at the bottom. Sometimes, extra supports are provided for additional support.

There are certain problems with use of such disc bellows in oil filled electrical equipment. There can be oil leakage due to fatigue failure (e.g. due to cracks/deformation) before its predefined life. Alternately, there can be oil leakage from crack generation at welding areas (or joints). Additionally, there may be inadequate axial movement for oil compensation, considering the limited capacity of the disc bellow.

These problems can be related to the stresses to which the disc bellow is exposed during processing/manufacturing, transportation, and/or normal functioning of such electrical equipment. The processing can typically involve assembly, vacuum drying, heating, oil filling and sealing (under pressure). Several times, the disc is found to be deformed during processing (e.g. vacuum and over pressing).

The extra supports, as shown in FIG. 2, are typically used to provide support during transport. Since the oil filled bellow has only one bottom support, and little support at the edge, it vibrates continuously and may face heavy shocks during transport (e.g. due to bad road conditions). Thus, the welding joint at the bottom disc and the supports face are likely to face severe stresses, which can result in cracks or deformation. If somehow, the bellow sustains transportation, it is still prone to failures. This is attributable to effect of stresses faced during transport, and stress concentration during its normal life span (about 30 years or so). Failure of this part is considered as failure of the electrical equipment (e.g. transformer failure).

There is accordingly a need for an oil filled electrical equipment that has an assembly with an expansion bellow, that is robust enough for surviving the processing and transportation, and that can endure the stresses during regular operation (i.e. for the lifespan of the transformer).

SUMMARY OF THE DISCLOSURE

The disclosure provides an oil filled electrical equipment comprising an assembly for oil filling and hermetically sealing the electrical equipment. The electrical equipment can be a transformer such as an instrument transformer.

The assembly comprises a cylindrical bellow mounted on a plate of the electrical equipment with one or more fittings. The cylindrical bellow is for pressure and volume compensation in the electrical equipment. In one embodiment, the cylindrical bellow is designed for axial movement to provide the pressure and volume compensation.

The cylindrical bellow comprises a cylinder with a plurality of convolutions and two covers. The cylinder can be made of thin stainless steel sheet with hydroforming process. The convolutions are for expanding and contracting (due to changes in oil temperature) to provide the pressure and volume compensation. The two covers are attached with the cylinder at two ends of the cylinder.

Each cover comprises a cylindrical part that is open at a first end and closed at a second end. The first end of the cylindrical part terminates at a circular face, which is for mounting the cover on a convolution at a corresponding end of the cylinder. The second end of the cylindrical part comprises an opening. This opening is for filling oil in the electrical equipment, and to hermetically seal the electrical equipment once the oil filling has been completed. Additionally, this opening is for mounting the cylindrical bellow on the plate with the one or more fittings. This plate can be a plate on a housing of the electrical equipment having corresponding opening for said oil filling and hermetically sealing (e.g. by using o-rings). Each cover can have an embossing near a fitting area on the second end for providing strength to the cylindrical bellow during manufacturing, assembly and running operation.

In the assembly, the cylindrical bellow is mounted on the plate with one or more fittings. In one embodiment, the assembly comprises two fittings, wherein each fitting is provided on a corresponding cover of the cylindrical bellow at the second end. The fitting can be used for the filling of oil, hermetically sealing the electrical equipment, and/or mounting the cylindrical bellow on the plate. Here, a first fitting of the two fittings (e.g. which is for interfacing with the plate) comprises a square opening at an end of the fitting. This opening can be used (e.g. by utilizing an appropriate tool) for applying torque to attach the bellow with the plate of the electrical equipment. For example, the fitting may have threads to attach with the plate (e.g. having corresponding interfaces), and an appropriate tool may be used to rotate the bellow to mount the bellow on the plate. The first fitting can be made from steel for providing stiffness and damping when the cylindrical bellow is full of oil.

In an embodiment, the assembly further comprises two or more clamps to hold the bellow at joints between the bellow and the plate. Here, the clamping is performed between the convolution (at the end of the cylinder) and the plate. Depending on the size of the bellow, the number of clamps can be determined. In one embodiment, four clamps are used. Thus, the cylindrical bellow is attached with the plate in a way that contact areas to keep under pretension force are between the cylindrical bellow and the plate are at the joints, and at a periphery of the first fitting.

BRIEF DESCRIPTION OF DRAWINGS

The subject matter of the disclosure will be explained in more detail in the following text with reference to exemplary embodiments which are illustrated in attached drawings in which.

DETAILED DESCRIPTION

The present disclosure relates to oil filled electrical equipment such as, but not limited to, instrument transformers, distribution transformers. The present disclosure provides an electrical equipment with an assembly for oil filling and hermetically sealing the electrical equipment. The assembly includes an expansion system for the hermetically sealed electrical equipment. The expansion system acts a pressure and volume compensation device, and overcomes the problems of the traditional disc bellows used in such electrical equipment. The expansion system of the present disclosure comprises a cylindrical bellow.

The cylindrical bellow is designed to operate in an axial direction with minimal lateral movement. It expands axially out when oil expands due to change in a parameter (e.g. temperature, pressure, volume etc.) and vice-versa. The cylindrical bellow in the hermetically sealed system keeps the pressure within working limits, even though oil pressure varies significantly in various conditions (e.g. during processing, climatic changes etc.).

Figure 1:
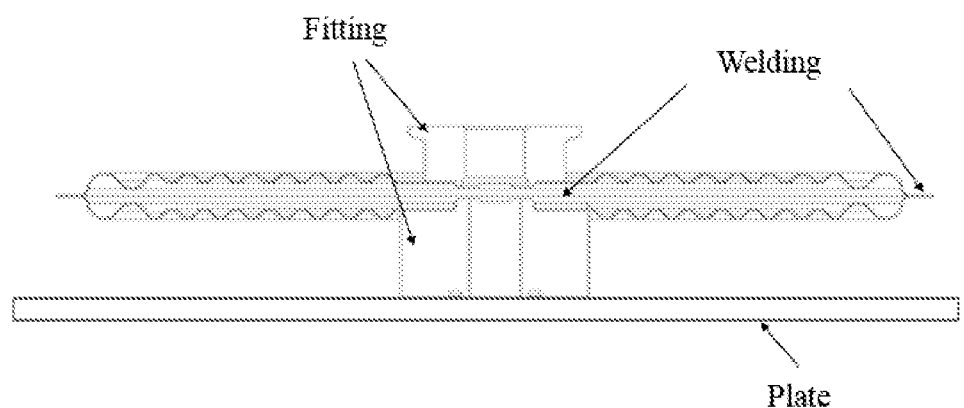
FIG. 1 illustrates a conventional disc bellow mounted on a plate of an electrical equipment.
Figure 2:
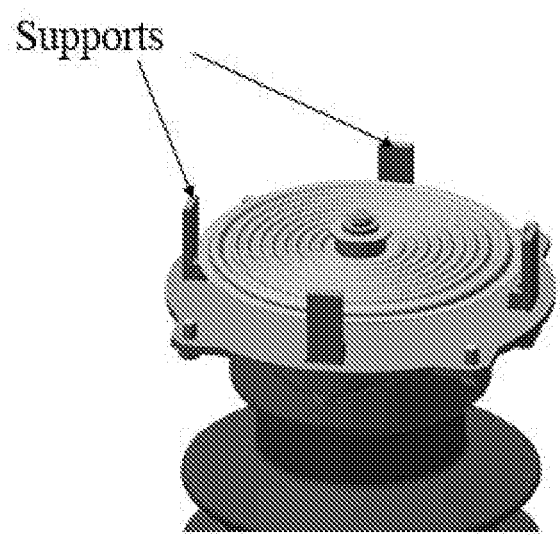
FIG. 2 illustrates conventional supports provided for the disc bellow.
Figure 3:
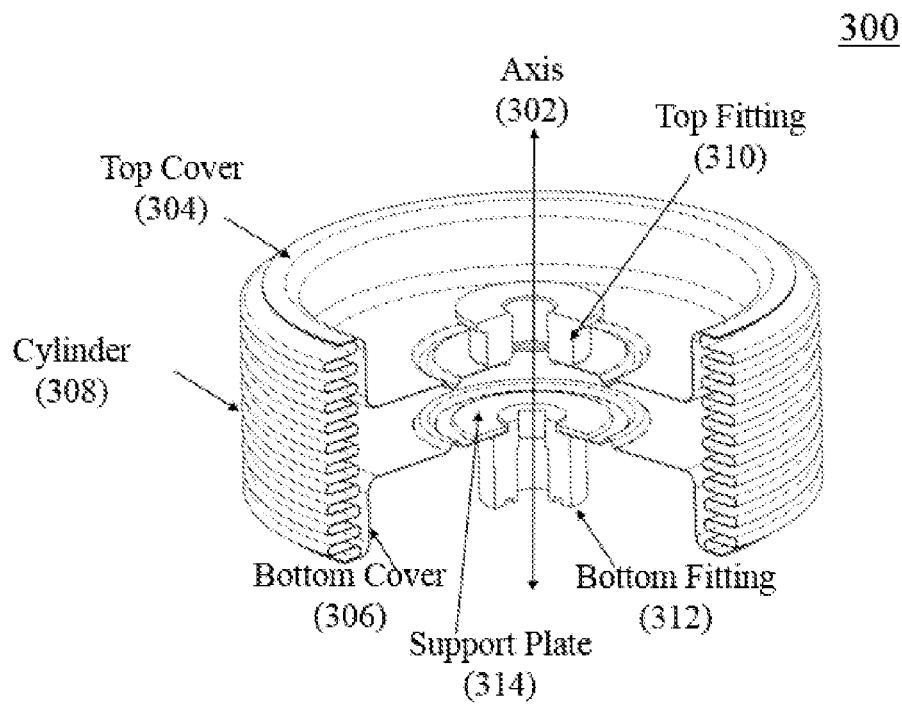
FIG. 3 shows a perspective sectional view of a cylindrical bellow (300), in accordance with an embodiment.

FIG. 3 shows a perspective sectional view of the cylindrical bellow (300). The cylindrical bellow expands/contracts axially (at 302) to provide for the pressure and volume compensation. As shown, the cylindrical bellow comprises two covers (304, 306) attached with a cylinder (308) comprising a plurality of convolutions. The two covers (i.e. top and bottom covers) are attached with (e.g. welded) a convolution at an end (e.g. top convolution, bottom convolution) to form the desired shape of the cylindrical bellow for the pressure and volume compensation (i.e. by expanding or contracting of cylinder 308 about axis 302).

Figure 4:
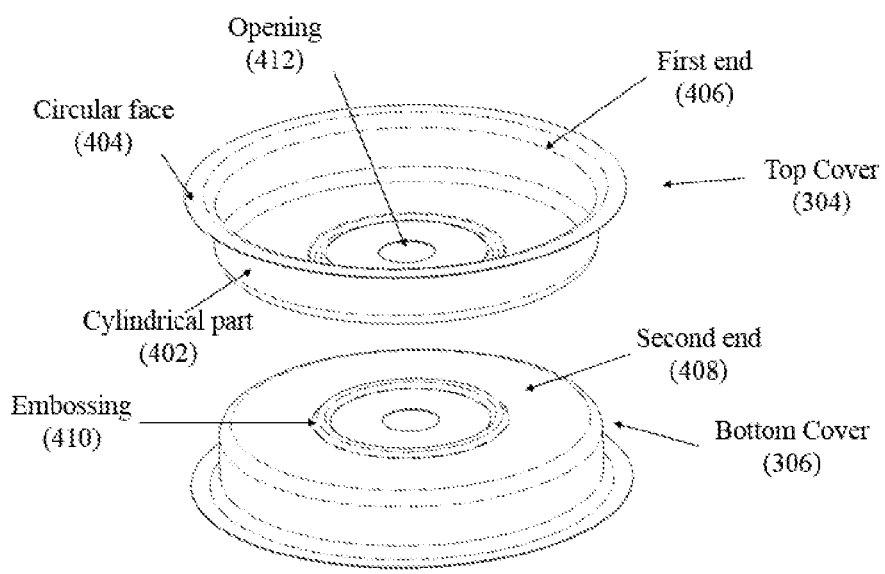
FIG. 4 shows covers of the cylindrical bellow.

Each cover is substantially cylindrical as shown in FIG. 4, with a cylindrical part (402) and a circular face (404) towards the end. Thus, the cylindrical part at a first end (406) is open, and closed at a second end (408), which creates a U-shape of the cover. This hollow U-shape provides many benefits. Some of them are saving in oil quantity, space provision and most important is for mounting. Also, the opening (412) provided at the second end enables oil filling, hermetic sealing and mounting of the bellow on the plate.

The space created by the shape of the cover provides for various uses. The space is used for fittings (see 310, 312 in FIG. 3), oil filling (top cover (302)), fixing the bellow (top and bottom cover (302, 304)), and optionally for torque application as described later. The flat circular face of the bottom cover rests on top of the main oil unit system. The embossing (410) near the fitting area gives strength to the bellow during processing at factory, and during vacuum and pressure rise in running operation, which minimizes the changes of any permanent deformation of the bellow.

Figure 5:
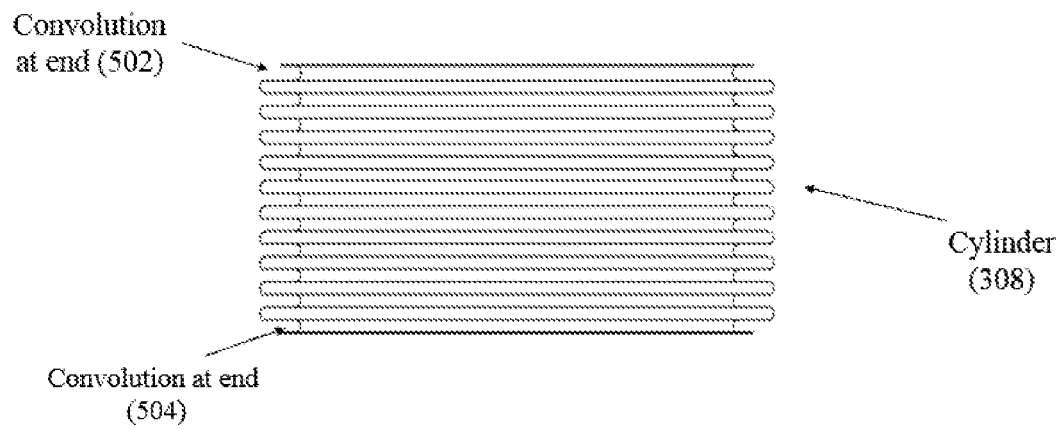
FIG. 5 shows a cylinder with a plurality of convolutions, of the cylindrical bellow.

The cylinder (308) with the plurality of convolutions is shown in FIG. 5. The cylinder expands and contracts in the axial direction (i.e. about 302) to provide for the desired compensation according to changes in oil temperature (or pressure, volume etc.). This part can be made of thin stainless steel sheet with hydroforming process. The dimensions of the cylinder depends on certain parameters such as, but not limited to, stroke length (e.g. expansion and contraction capacity), working pressure and number of life cycle. The number of convolutions is adjustable, depending on the bellow specifications (e.g. to compensate for thermal expansion of oil volume and pressure variation). Higher the number of convolution higher will be the capacity of expansion and contraction. The convolutions (502, 504) at the end are where the covers (304, 306) at attached.

Figure 6:
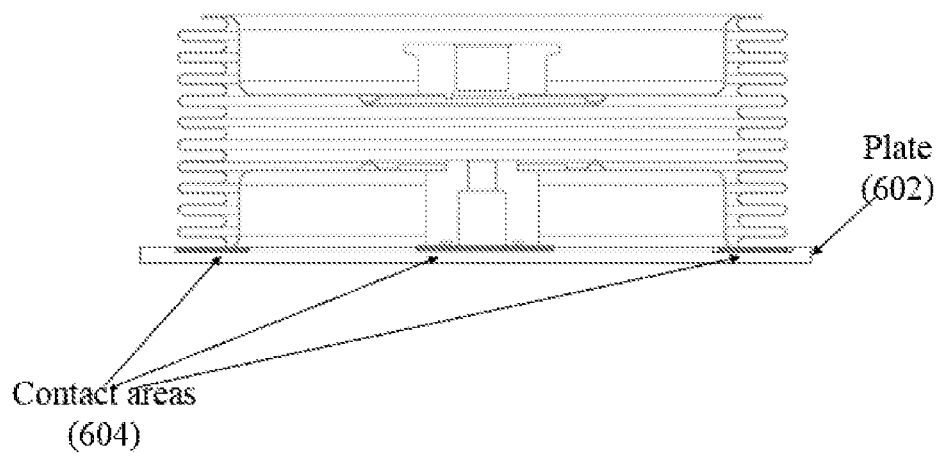
FIG. 6 shows contract areas of an assembly of the cylindrical bellow with a plate of an electrical equipment, in accordance with an embodiment.

Two fittings are provided, a top fitting (310) attached with the top cover (304), and a bottom fitting (312) on the bottom cover (306) as shown in FIG. 3. The cylindrical bellow is mounted on top of a main assembly of the electrical equipment. The cylindrical bellow is arranged on a plate (602) (e.g. of the transformer) to keep under pretension force at the contact areas (604) as highlighted in FIG. 6 at the outer periphery.

Figure 7:
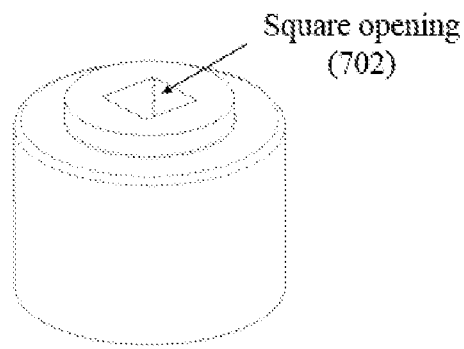
FIG. 7 shows a fitting of the assembly, in accordance with an embodiment.

The bellow is attached with the plate (602) using the bottom fitting (312). In an embodiment shown in FIG. 7, the design of the flat circular surface of the bottom cover and the bottom fitting assists in creating pretension. The bottom fitting is a compact part, which can be made of steel and specially designed to mount the bellow on the main unit. In one embodiment, the bottom end of the fittings has threads (not shown) to fix on top of unit. In the embodiment of FIG. 7, a square opening (702) is provided at the top (e.g. machined by broaching) of the bottom fitting (312). This can be used for applying torque (e.g. like a nut). This can assist in preventing stress involved in fixing the bellow with the main unit. As the square opening is provided, the same can be used (e.g. with an appropriate tool) for rotation of the bellow, for fixing the bellow with the main unit (e.g. on a corresponding fitting of the transformer). The bottom fitting also provides stiffness and damping when the bellow is full of oil and has to sustain against random vibrations and shocks.

Figure 8:
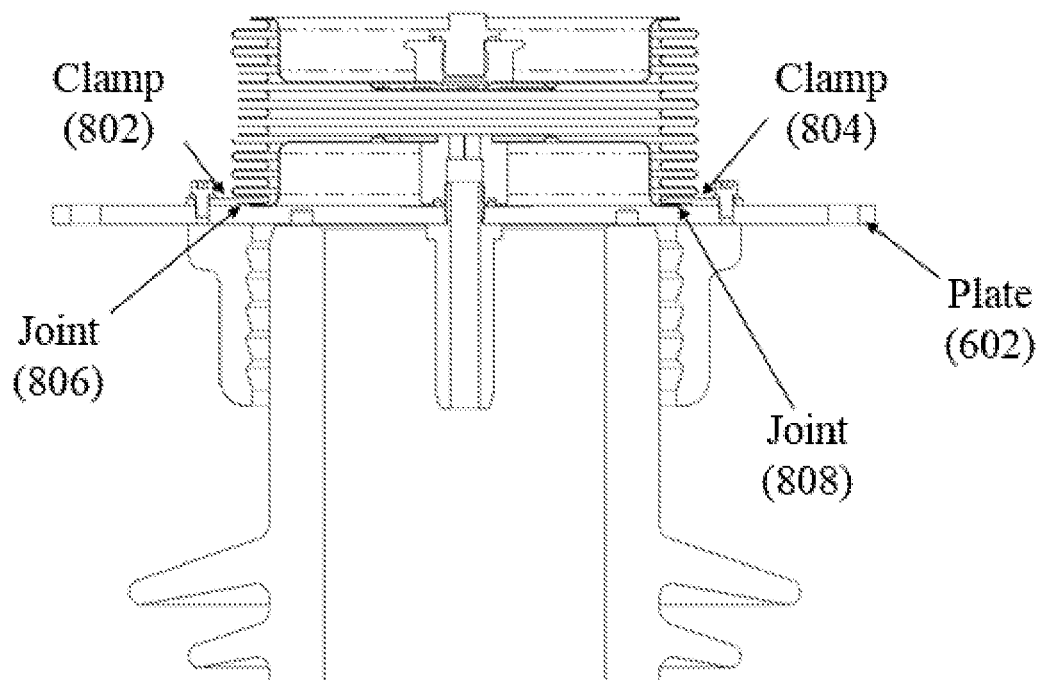
FIG. 8 shows a mounting of the assembly on the plate with the fitting, in accordance with an embodiment.
Figure 9:
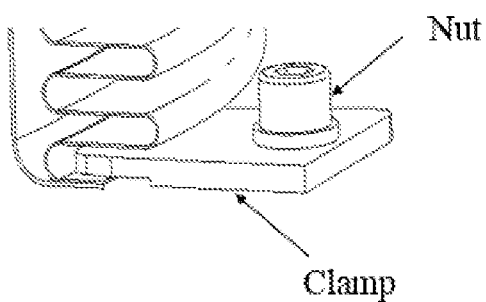
FIG. 9 is an expanded view of a clamping of the cylindrical bellow shown in the mounting of the assembly.

Optionally, one or more clamps (hold clamps 802, 804), are used for attaching the bellow with the plate as shown in FIG. 8. The number of clamps can be decided based on the bellow capacity. In one embodiment, four clamps are used. The clamps hold the bellow firmly at the joints (e.g. 806, 808) between the convolution/cover at the end and the plate), as shown in FIG. 9. The clamps help to reduce the fatigue stress generation during life cycle operation.

Thus, the electrical equipment with the expansion system of the present disclosure is better capable to sustain random vibrations and shocks in different directions, as compared to the conventional electrical equipment. The cylindrical bellow is designed for axial movement, and to stay firmly mounted during transportation and during normal working after installation at site. Further, the oil volume compensation is significantly higher as compared to disc bellows, as a result of the compensation provided axially (due to the convolutions). The optional square opening on the bottom fitting provides for torque application for proper fixing. The optional supports (clamps) provided at bottom also assist in minimizing stresses faced during transport.

We claim:

1. An oil filled electrical equipment, comprising an assembly for oil filling and hermetically sealing the electrical equipment, wherein the assembly comprises a cylindrical bellow mounted on a plate of the electrical equipment with one or more fittings, for pressure and volume compensation in the electrical equipment, wherein the cylindrical bellow comprises:
    a cylinder with a plurality of convolutions configured to expand and contract to provide the pressure and volume compensation; and
    two covers attached with the cylinder at two ends of the cylinder, wherein each cover comprises a cylindrical part that is open at a first end and closed at a second end, wherein the first end terminates at a circular face configured to mount the cover on a convolution of the plurality of convolutions at a corresponding end of the cylinder, and wherein the second end comprises an opening for the oil filling and hermetically sealing the electrical equipment, and mounting the cylindrical bellow on the plate with the one or more fittings.

2. The oil filled electrical equipment of claim 1, wherein the assembly, each fitting of the one or more fittings is mounted on a corresponding cover at the second end of the cylindrical part for the oil filling and hermetically sealing the electrical equipment, and wherein a first fitting of the one or more fittings comprises a square opening at one end configured to apply torque to attach the bellow with the plate of the electrical equipment.

3. The oil filled electrical equipment of claim 2, wherein the assembly further comprises two or more clamps, wherein each clamp holds the cylindrical bellow at a joint between the convolution and the plate.

4. The oil filled electrical equipment of claim 3, wherein the cylindrical bellow is attached with the plate such that contact areas to keep under pretension force are between the cylindrical bellow and the plate are at the joints, and at a periphery of the first fitting.

5. The oil filled electrical equipment of claim 2, wherein the first fitting is made from steel configured to provide stiffness and damping when the cylindrical bellow is full of oil.

6. The oil filled electrical equipment of claim 1, wherein the assembly, the cylindrical bellow is configured for axial movement about an axis to provide the pressure and volume compensation.

7. The oil filled electrical equipment of claim 1, wherein each cover comprises an embossing near a fitting area on the second end configured to provide strength to the cylindrical bellow during manufacturing, assembly and running operation.

8. The oil filled electrical equipment of claim 1, wherein the cylinder with the plurality of convolutions is made of thin stainless steel sheet with hydroforming process.

9. The oil filled electrical equipment of claim 1, wherein the electrical equipment comprises an instrument transformer.

10. A cylindrical bellow for pressure and volume compensation in an oil-filled electrical equipment, the cylindrical bellow comprising:
    a cylinder with a plurality of convolutions configured to expand and contract to provide the pressure and volume compensation; and
    two covers attached with the cylinder at two ends of the cylinder, wherein each cover comprises a cylindrical part that is open at a first end and closed at a second end, wherein the first end terminates at a circular face configured to mount the cover on a convolution of the plurality of convolutions at a corresponding end of the cylinder, and wherein the second end comprises an opening for oil filling and hermetically sealing the electrical equipment and mounting the cylindrical bellow on a plate of the electrical equipment with one or more fittings.

* * * * *